(12) United States Patent
Bathgate et al.

(10) Patent No.: US 9,231,544 B2
(45) Date of Patent: Jan. 5, 2016

(54) AGC CIRCUIT FOR AN ECHO CANCELLING CIRCUIT

(71) Applicants: Dialog Semiconductor GmbH, Kirchheim/Teck-Nabern (DE); Dialog Semiconductor B.V., 's-Hertogenbosch (NL)

(72) Inventors: Lee Bathgate, Dunfermline (GB); Michiel Andre Helsloot, 's-Hertogenbosch (NL); Paul Shields, Dunblane (GB); Christopher Piggin, Edinburgh (GB)

(73) Assignees: Dialog Semiconductor GmbH, Kirchheim/Teck-Nabern (DE); Dialog Semiconductor B.V., 's-Hertogenbosch (NL)

( * ) Notice: Subject to any disclaimer, the term of this patent is extended or adjusted under 35 U.S.C. 154(b) by 261 days.

(21) Appl. No.: 13/785,205

(22) Filed: Mar. 5, 2013

(65) Prior Publication Data
US 2013/0336494 A1    Dec. 19, 2013

(30) Foreign Application Priority Data
Jun. 13, 2012  (EP) ................................. 12171808

(51) Int. Cl.
H03G 3/20   (2006.01)
H03G 9/00   (2006.01)
H03G 9/02   (2006.01)

(52) U.S. Cl.
CPC ............... *H03G 3/20* (2013.01); *H03G 9/005* (2013.01); *H03G 9/025* (2013.01)

(58) Field of Classification Search
CPC .......... H03G 3/20; H03G 9/005; H03G 9/025
USPC ......... 381/66, 107, 94.1, 98, 104; 379/406.01
See application file for complete search history.

(56) References Cited

U.S. PATENT DOCUMENTS

| 5,724,433 | A   | 3/1998 | Engebretson et al. |
| 7,013,011 | B1  | 3/2006 | Weeks et al. |
| 8,965,011 | B2* | 2/2015 | Helsloot ............... H03G 7/002 |
| | | | 379/406.01 |

(Continued)

FOREIGN PATENT DOCUMENTS

EP    2200340    6/2010

OTHER PUBLICATIONS

European Search Report 12171808.4-1810 Mail date—Mar. 25, 2013, Dialog Semiconductor GmbH, et al.

*Primary Examiner* — Harry S Hong
(74) *Attorney, Agent, or Firm* — Saile Ackerman LLC; Stephen B. Ackerman

(57) ABSTRACT

An amplifier circuit and a method of amplification using automatic gain control (AGC) are disclosed. A method for reducing distortions incurred by an audio signal when being rendered by an electronic device is described. The method comprises receiving an input signal; determining signal strength; determining a frequency-dependent AGC filter; wherein the frequency-dependent AGC filter is adapted to selectively attenuate the input signal within a number N of predetermined frequency ranges, according to corresponding N degrees of attenuation; wherein N predetermined frequency ranges depend upon a rendering characteristic of the electronic device; and wherein the N-degrees of attenuation depend upon the signal strength; and attenuating the input signal using the frequency-dependent AGC filter to obtain an output signal for rendering by the electronic device.

19 Claims, 7 Drawing Sheets

(56) References Cited

U.S. PATENT DOCUMENTS

| | | |
|---|---|---|
| 2002/0015503 A1 | 2/2002 | Hou |
| 2004/0019481 A1 | 1/2004 | Saito |
| 2009/0097676 A1 | 4/2009 | Seefeldt |
| 2010/0142727 A1* | 6/2010 | Otani et al. ..................... 381/98 |
| 2010/0254546 A1 | 10/2010 | Hosomi |
| 2012/0206195 A1* | 8/2012 | Helsloot ................ H03G 9/025 327/552 |

* cited by examiner

AGC CIRCUIT FOR AN ECHO CANCELLING CIRCUIT

TECHNICAL FIELD

The present document relates to an amplifier circuit and a method of amplification using automatic gain control (AGC). In particular, the present document relates to AGC circuits with optimized reference signal energy levels for an echo cancelling circuits.

BACKGROUND

Many electrical circuits or electronic devices require a conditioning of a signal to obtain a conditioned signal that satisfies certain predetermined requirements as to e.g. signal level of the signal. For example, a transducer (e.g. a loudspeaker) may perform optimally within a certain range of the signal level delivered to the transducer. For this purpose, amplifier circuits and amplification methods may be used that receive an input signal, amplify the input signal by a gain factor to obtain an output signal, and deliver the output signal to the transducer of the electronic device for rendering.

The amplifier circuits and amplification methods may make use of automatic gain control schemes in order to determine the gain factor applied to the input signal. The gain factor may be determined such that the output signal has a predetermined signal level. The present document addresses the particular aspect of electronic devices comprising transducers (e.g. loudspeakers) which may be operated in a hands-free mode. In this context, it is desirable to determine the gain factor such that the loudspeaker and cabinet acoustic distortions and mechanical resonances are reduced (e.g. minimized). Furthermore, the gain factor should be determined such that the overall signal level of the output signal at the loudspeaker is increased (e.g. maximized). In addition, electronic devices (e.g. cordless or mobile telephones) typically comprise an echo canceller. The gain factor should be determined such the acoustic echo canceller performance is improved.

SUMMARY

A principal object of the present disclosure is to achieve an automatic gain controller (AGC) and a corresponding attenuation method allowing for an increased overall output level of a receive signal at an electronic device operated in hands-free mode, while at the same time reducing acoustic and mechanic distortions caused by the rendering of the receive signal by the electronic device Another principal object of the present disclosure is to use one or more notch attenuation filters which are configured to attenuate the receive signal in one or more corresponding distorting frequency ranges A further objective of the present disclosure is to adapt a degree or magnitude of attenuation of the one or more notch attenuation filters to the signal level of the receive signal in the one or more distorting frequency ranges.

According to the objectives of the disclosure an automatic gain controller (AGC) configured to reduce distortions incurred by an audio signal when being rendered by an electronic device has been achieved, The automatic gain controller comprising: a gain controller configured to determine a signal strength based on an input signal to be rendered by the electronic device; and determine a frequency-dependent AGC filter; wherein the frequency-dependent AGC filter is adapted to selectively attenuate the input signal within a number N of predetermined frequency ranges, N being an integer, N>0, according to corresponding N degrees of attenuation; wherein the N predetermined frequency ranges depend upon a rendering characteristic of the electronic device; and wherein the N degrees of attenuation depend upon the signal strength. Furthermore the automatic gain controller comprises an AGC filter unit configured to attenuate the input signal using the frequency-dependent AGC filter to obtain an output signal for rendering by the electronic device.

According to the objectives of the disclosure an electronic device has been disclosed. The electronic device comprises: a reception unit configured to receive an audio input signal for rendering at the electronic device, a transducer configured to render an audio output signal derived from the audio input signal, and an automatic gain controller according to claim 13, configured to determine the audio output signal from the audio input signal, such that nonlinear distortions caused by the rendering of the audio output signal are reduced compared to nonlinear distortions caused by the rendering of the audio input signal.

According to the objectives of the disclosure an Automatic Gain Controller (AGC) adapted to apply a frequency-dependent AGC filter to a receive signal has been achieved. The AGC comprises: a gain controller comprising: a signal strength determination unit configured to determine N sub-signal strengths of the receive signal for N predetermined frequency ranges, wherein N is an integer number N>0, an AGC filter determination unit adapted to select an AGC filter from an AGC filter database using the determined signal strength by the signal strength determination unit wherein the AGC filter selected to a receive signal of the AGC controller in a AGC filter unit, and said AGC filter database comprising a plurality of pre-determined AGC filters, wherein each of the plurality of pre-determined AGC filters is adapted to apply different degrees of attenuation within the N predetermined frequency ranges. Furthermore the AGC comprises said AGC filter unit yielding an attenuated receive signal.

According to the objectives of the disclosure a method for reducing distortions incurred by an audio signal when being rendered by an electronic device has been disclosed. The method disclosed comprises: receiving an input signal, determining a signal strength based on the input signal, determining a frequency-dependent AGC filter; wherein the frequency-dependent AGC filter is adapted to selectively attenuate the input signal within a number N of predetermined frequency ranges, N being an integer, N>0, according to corresponding N degrees of attenuation; wherein the N predetermined frequency ranges depend upon a rendering characteristic of the electronic device; and wherein the N degrees of attenuation depend upon the signal strength, and attenuating the input signal using the frequency-dependent AGC filter to obtain an output signal for rendering by the electronic device.

According to an aspect a method for reducing distortions incurred by an audio signal when being rendered by an electronic device is described. The electronic device may e.g. be a wireless or cordless communication device. By way of example, the electronic device may be a telephone or may comprise a telephone application. In particular, the electronic device comprises a transducer (e.g. a loudspeaker) for rendering the audio signal. The rendering of the audio signal may cause nonlinear audible distortions, which may be due to acoustic and/or mechanical resonances at the electronic device (e.g. due to the speaker housing, the circuit board within the device, and the device casing).

The method may comprise receiving an input signal. The electronic device may comprise a so called receive path and a so called transmit path. In particular, the electronic device may receive an audio signal on the receive path for rendering by the transducer, and the electronic device may generate an audio signal (e.g. using a microphone of the electronic device) for transmission along the transmit path. The input signal may be an audio input signal on the receive path of the electronic device. The method may proceed in determining signal strength based on the input signal. The signal strength may e.g. be the signal level or the signal power of the input signal or of a signal derived from the input signal (e.g. the signal strength of an emphasized input signal or the signal strength of a signal derived from the output signal which is to be rendered by the electronic device). The signal strength may be determined across the entire frequency range of the input signal and/or across sub-ranges of the entire frequency range.

The method may comprise determining a frequency-dependent AGC filter, such that the frequency-dependent AGC filter is adapted to selectively attenuate the input signal (or a delayed version thereof) within a number N of predetermined frequency ranges, N being an integer, N>0 (e.g. N>1). In particular, the frequency-dependent AGC filter may be adapted to attenuate the input signal within a number N of predetermined frequency ranges according to corresponding N degrees of attenuation. The N degrees of attenuation may be different for the N different predetermined frequency ranges. Furthermore, each of the N degrees of attenuation may vary within the N predetermined frequency ranges. As such, the frequency-dependent AGC filter may have a frequency-dependent frequency response, such that the degree of attenuation which is applied by the frequency-dependent AGC filter to the input signal is different for different frequencies. In particular, the input signal may comprise a first component with frequencies lying within at least one of the N predetermined frequency ranges and a second component with frequencies lying outside of the N predetermined frequency ranges. The frequency response of the frequency-dependent AGC filter may be such that the degree of attenuation applied to the first component is higher than the degree of attenuation applied to the second component.

The N predetermined frequency ranges may depend upon a rendering characteristic of the electronic device. The rendering characteristic may be represented by one or more of: a frequency dependent total harmonic distortion (THD) of the electronic device, an echo canceller performance of an echo canceller comprised within the electronic device, a battery level of a battery comprised within the electronic device, a volume setting of a volume controller comprised within the electronic device, a temperature of the electronic device, humidity, air pressure and other physical properties of the electronic device and its direct environment. The rendering characteristic may provide an indication of the degree and/or the frequency of nonlinear distortions caused by the electronic device when rendering the audio signal (e.g. when rendering an audio signal derived from the input signal).

As indicated above, the frequency-dependent AGC filter may be adapted to selectively attenuate the input signal within the N predetermined frequency ranges according to corresponding N degrees of attenuation. The N degrees of attenuation may depend upon the signal strength. The method may comprise the step of determining that the signal strength is above a signal strength threshold. The method may be adapted to only apply the N degrees of attenuation if it is determined that the signal strength is above a signal strength threshold. If it is determined that the signal strength is below the signal strength threshold the degrees of attenuation may be substantially zero (if measured in dB) (or below a predetermined attenuation threshold), i.e. the input signal may be left substantially unchanged. The signal strength threshold may be determined based on the rendering characteristic. In particular, the signal strength threshold may be determined such that for audio signals with signal strength at or below the signal strength threshold, the degree of nonlinear distortions caused when rendering the audio signals is below an acceptable distortion threshold. As such, the degrees of attenuation may be determined such that if the signal strength is below the predetermined signal strength threshold, the N degrees of attenuation are substantially zero. On the other hand, if the signal strength is greater than the predetermined signal strength threshold, the N degrees of attenuation may increase with increasing signal strength.

As indicated above, the N degrees of attenuation may vary within the N predetermined frequency ranges. In particular, the N degrees of attenuation may vary in accordance to the rendering characteristic of the electronic device. Typically, the rendering characteristic provides an indication of the degree of nonlinear distortions as a function of the frequency. In such cases, the degrees of attenuation may vary as a function of the frequency in a proportional manner to the rendering characteristic (which is typically a function of the frequency). In other words, the degrees of attenuation within the predetermined frequency ranges may be substantially proportional to the degree of nonlinear distortions within the predetermined frequency ranges. The proportionality factor may be dependent on the determined signal strength.

The method may comprise attenuating the input signal (or a delayed version thereof) using the frequency-dependent AGC filter to obtain an output signal for rendering by the electronic device. The output signal may be further submitted to a volume control prior to rendering by the electronic device. The volume control level may be taken into account when determining the frequency-dependent AGC filter.

The frequency-dependent AGC filter may comprise a sequence of N sub-filters, each one of the N sub-filters having a frequency response adapted to selectively attenuate the input signal within a corresponding one of the N predetermined frequency ranges according to a corresponding one of the N degrees of attenuation. As such, each of the N sub-filters may be adapted to the rendering characteristic of the electronic device within a respective one of the N predetermined frequency ranges. The N sub-filters may be implemented as bi-quad IIR filters, respectively. Higher order IIR filters may be used, e.g. when increasing the degrees of attenuation, thereby allowing for an improved fitting of the N sub-filters to the rendering characteristic. It should be noted that the N sub-filters may be implemented using other filter topologies, e.g. FIR (finite impulse response) filters.

The N predetermined frequency ranges typically depend on the rendering characteristic of the electronic device. In particular, the N predetermined frequency ranges may correspond to N frequency ranges within which the electronic device creates a relatively high degree of nonlinear distortions (e.g. degrees of nonlinear distortions which lie above the distortion threshold). The N predetermined frequency ranges may be described by respective center frequencies (at which the electronic device exhibits local maximum degrees of nonlinear distortions). Furthermore, the N predetermined frequency ranges may be described by respective distortion bandwidths (which correspond to frequency intervals around the respective center frequencies and which reflect the frequencies at which the electronic device creates a relatively increased degree of nonlinear distortions, e.g. greater than a distortion threshold). As such, the N predetermined frequency ranges identify the frequency intervals which are particularly relevant for undesirable resonance effects.

The input signal typically comprises problematic components at frequencies which lie within the N predetermined frequency ranges and unproblematic (typically non-distorting) components at frequencies which are not comprised within the N predetermined frequency ranges. The frequency-dependent AGC filter is typically determined such that the unproblematic components of the input signal are not substantially attenuated.

The method may comprise determining N signal strengths based on the input signal in the N predetermined frequency ranges, respectively. As indicated above, the signal strengths may e.g. be signal levels or signal powers. The N signals strengths may reflect the signal strength of the components of the input signal which comprise frequencies from within the N predetermined frequency ranges, respectively. By way of example, the N signal strengths may be determined by only considering the frequencies of the input signal lying within the N predetermined frequency ranges, respectively. The method may then comprise determining the N degrees of attenuation based on the N signal strengths, respectively. In other words, each of the N degrees of attenuation may be determined based on the respective one of the N signal strengths.

The method may further comprise applying an emphasis filter to at least one of a copy of the input signal (feed-forward signal) and a copy of the output signal (feedback signal) to obtain a filtered signal. The emphasis filter may be adapted to emphasize a signal (e.g. the feed-forward signal or the feedback signal) within one or more of the N predetermined frequency ranges. The emphasis filter may comprise a sequence of N sub-emphasis-filters. Each one of the N sub-emphasis-filters may have a frequency response adapted to emphasize a signal (e.g. the feed-forward signal or the feedback signal) within a corresponding one of the N predetermined frequency ranges. As such, the emphasis filter may be adapted to emphasize the signal strength of (a copy of) the feed-forward signal or the feedback signal within the N predetermined frequency ranges. In such cases, the method may comprise determining the signal strength based on the filtered signal.

According to a further aspect, an automatic gain controller (AGC) configured to reduce nonlinear distortions incurred by an audio signal when being rendered by an electronic device is described. The AGC may be part of the electronic device. The AGC may comprise a gain controller configured to determine a signal strength based on an input signal which is to be rendered by the electronic device. Furthermore, the gain controller may be configured to determine a frequency-dependent AGC filter. As outlined above, the frequency-dependent AGC filter may be adapted to selectively attenuate the input signal within a number N of predetermined frequency ranges, N being an integer, N>0, according to corresponding N degrees of attenuation. The N predetermined frequency ranges may depend upon a rendering characteristic of the electronic device and the N degrees of attenuation may depend upon the signal strength. Furthermore, the AGC comprises an amplifier configured to attenuate the input signal using the frequency-dependent AGC filter to obtain an output signal for rendering by the electronic device. In particular, the amplifier may be configured to attenuate the input signal within the N predetermined frequency ranges while leaving substantially unaffected the components of the input signal at frequencies which lie outside of the N predetermined frequency ranges.

According to another aspect, an electronic device is described. The electronic device comprises a reception unit configured to receive an audio input signal for rendering at the electronic device. Furthermore, the electronic device comprises a transducer configured to render an audio output signal derived from the audio input signal. In addition, the electronic device comprises an automatic gain controller according to any of the aspects outlined in the present document. The AGC may be configured to determine the audio output signal from the audio input signal, such that nonlinear distortions caused by the rendering of the audio output signal are reduced compared to nonlinear distortions caused by the rendering of the audio input signal, i.e. compared to nonlinear distortions caused by the rendering of a signal which has not been submitted to the AGC described herein.

According to a further aspect, a software program is described. The software program may be adapted for execution on a computing device and for performing the method steps outlined in the present document when carried out on the computing device.

According to another aspect, a storage medium is described. The storage medium may comprise a software program adapted for execution on a computing device and for performing the method steps outlined in the present document when carried out on the computing device.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. Furthermore, all aspects of the methods and systems outlined in the present document may be arbitrarily combined. In particular, the features of the claims may be combined with one another in an arbitrary manner.

BRIEF DESCRIPTION OF THE DRAWINGS

In the accompanying drawings forming a material part of this description, there is shown:

FIG. 1b shows example resonance cavities within the electronic device of FIG. 1a;

DETAILED DESCRIPTION OF THE DISCLOSURE

Figure 1A:
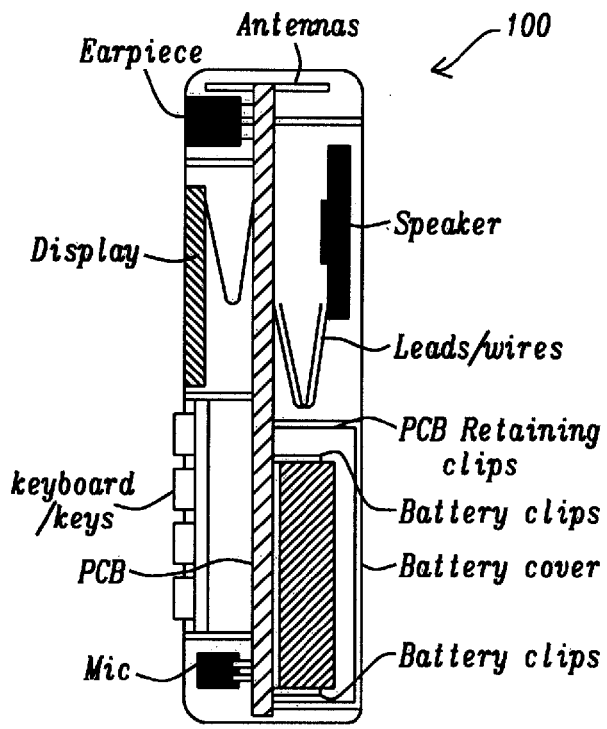
FIG. 1a illustrates an example electronic device with potential sources of mechanical vibrations.
Figure 1B:
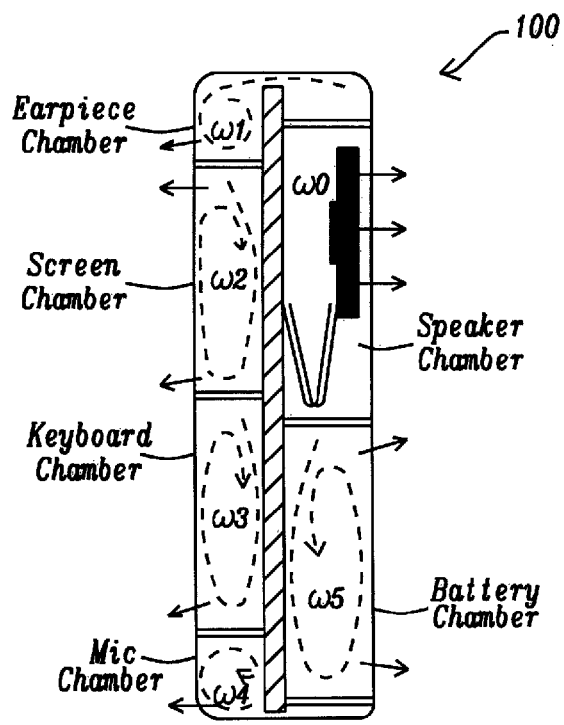

FIGS. 1a and 1b illustrate an example device 100 with which (and in particular within which) the systems and methods described in the present document may be used. The example device 100 comprises a transducer (in the present example a speaker) which is surrounded by a cabinet (also referred to as an enclosure, casing or housing). The example electronic device 100 may be a cordless handset or a wireless telephone. Further examples are a desk phone (e.g. PSTN/VoIP or other) or a wireless base station with hands-free capabilities. The device 100 may be subject to various mechanical resonances caused by the different components of the device, such as the keyboard and keys, the display, the printed circuit board (PCB), the wires and the leaded components, the mounted antennas, the battery clips and cover, and the telephone receiver. Furthermore, the device 100 may be subject to various acoustic resonances in the various chambers within the device 100 (see FIG. 1b). The combination of mechanical and acoustic resonances leads to a complex total harmonic distortion characteristic of the device 100, as illustrated e.g. by the diagram 206 in FIGS. 2a and 2b.

Figure 2A:
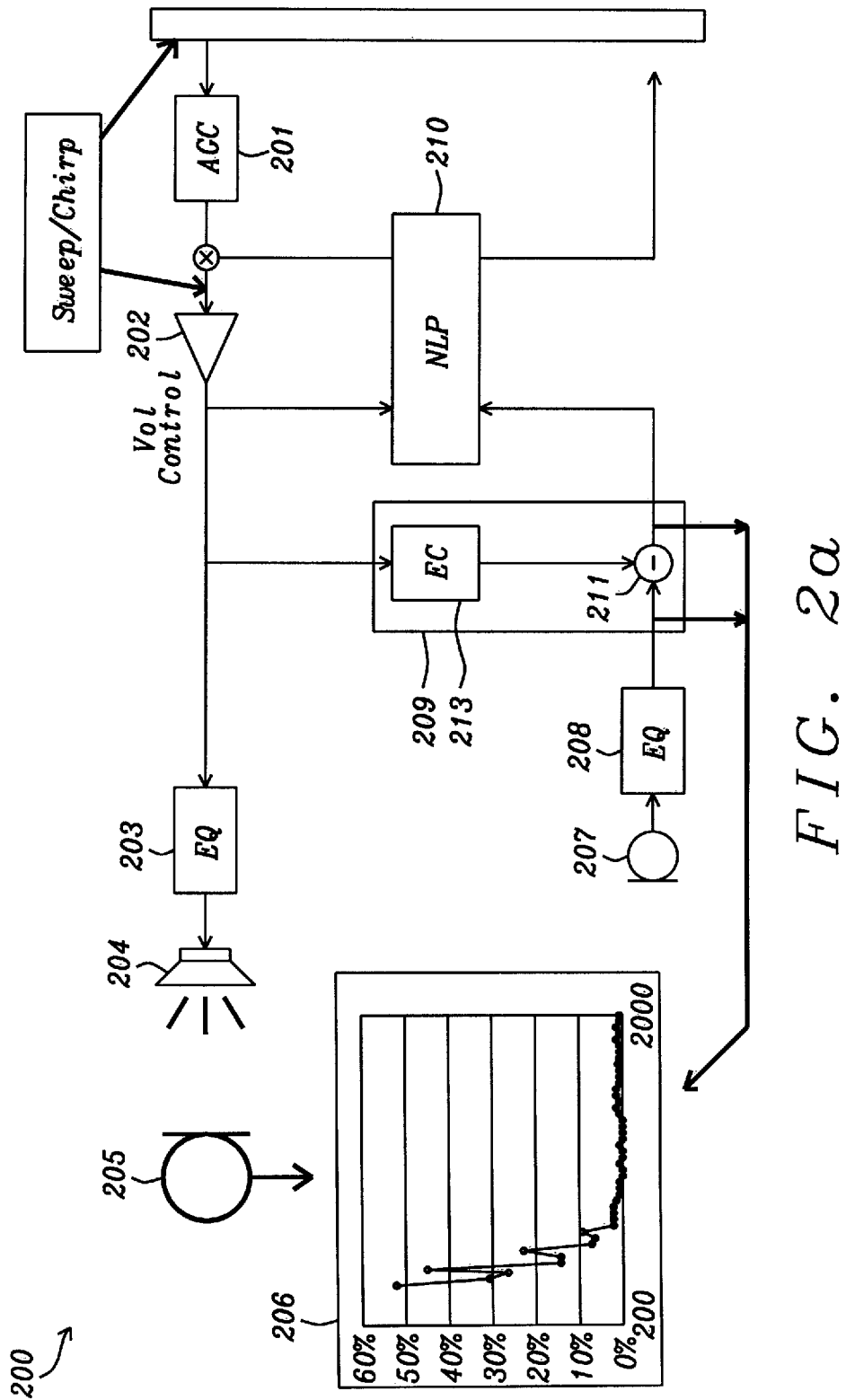
FIG. 2a illustrates an example electronic device comprising an echo canceller and an example scheme for measuring a rendering characteristic (e.g. a Total Harmonic Distortion or an echo canceller performance) of the electronic device.

In FIG. 2a, an example setup 200 for measuring the total harmonic distortion (THD) characteristic of an example transducer 204 (a speaker) and/or for measuring the performance of an example echo canceller 209 of an electronic device 100 is illustrated. The setup 200 comprises the components of the electronic device 100, i.e. notably an automatic gain controller (AGC) 201, a volume controller 202, an equalization filter 203 and the speaker 204 (i.e. the transducer 204) on the downstream or receive signal path of the electronic device 100. Furthermore, the setup 200 comprises means for generating a sweep of sinusoids at different frequencies (and/or possibly white noise) at the input to the downstream signal path. The emitted sweep of sinusoids (or the white noise) may be recorded using an external microphone 205. The external microphone 205 records the acoustic signal emitted by the speaker 204 which is excited by a sinusoid at a particular frequency f (or by the white noise). The emitted acoustic signal comprises signal power at the particular frequency f. Furthermore, the emitted acoustic signal may comprise signal power at higher harmonic frequencies of the particular frequency f (i.e. at higher harmonic frequencies of the fundamental frequency f). Such signal power at higher harmonic frequencies may be due to non-linear distortions (e.g. resulting from acoustic or mechanical resonances) of the signal at the fundamental frequency f.

Figure 2B:
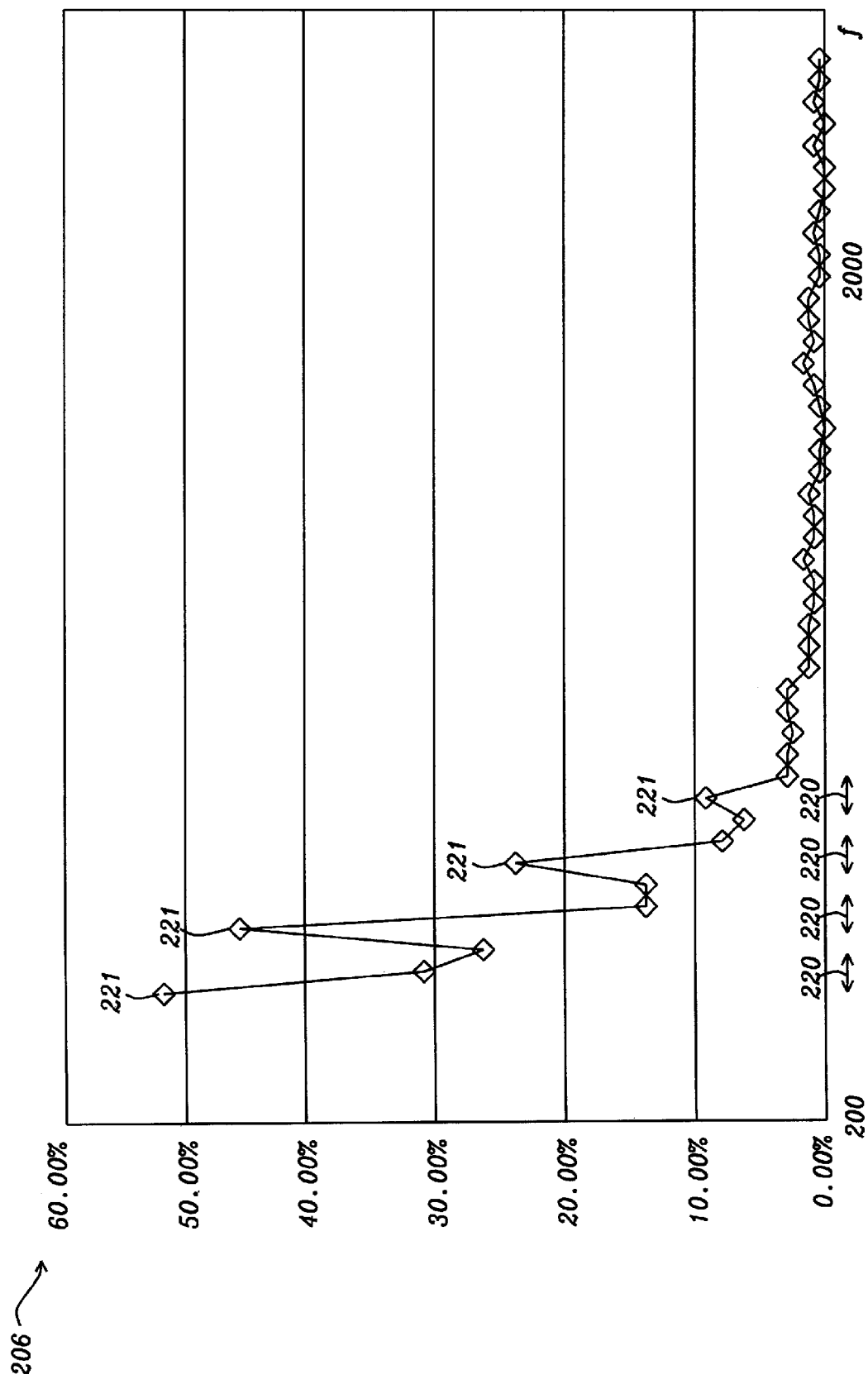
FIG. 2b shows an example Total harmonic Distortion curve.

The THD for the particular frequency f, i.e. THD(f), may be determined from the energy or power of the emitted audio signal at the particular frequency f, and from the energy or power of the emitted audio signal at (all) the higher and possibly lower harmonic (and possibly non-harmonic) frequencies. By way of example, the THD for the particular frequency f may be determined as the ratio of the sum of all powers of the higher harmonic frequencies to the power of the particular (fundamental) frequency f. An example THD characteristic 206 is illustrated in FIGS. 2a and 2b. It can be seen that the THD (f) curve 206 comprises a plurality of local maxima 221 for particular frequencies f for which a relatively high amount of distortion power at other frequencies than the frequency f is generated. These local maxima 221 lie within the frequency ranges 220. In particular, a local maximum 221 may lie at a center frequency of a corresponding frequency range 220. Furthermore, the frequency range 220 may have a certain bandwidth. The bandwidth may indicate the frequency interval around the center frequency within which the THD (f) curve 206 exhibits a relative elevation leading to the local maximum 221.

Alternatively or in addition, the setup 200 may be used to determine the echo canceller performance vs. frequency. The electronic device 100 may comprise an echo canceller 209 on the transmit path of the electronic device 100. The echo canceller 209 tries to estimate and to cancel an echo of the receive signal captured by a microphone 207 of the electronic device. For determining the echo canceller performance vs. frequency, the emitted sweep of sinusoids is recorded using the internal microphone 207 of the electronic device 100. The recorded (or captured) audio signal may be processed by an equalization filter 208 within the upstream or transmit signal path of the electronic device 100. Subsequently, the recorded audio signal is corrected by a predicted audio signal at the output of the echo cancellation filter 209 using the echo cancellation adder, thereby yielding an echo cancelled signal. The predicted audio signal is determined from the audio signal on the receive signal path using the echo cancellation filter 209. For this purpose, the echo cancellation filter 209 may make use of a linear prediction filter which determines the predicted audio signal as a weighted linear combination of one or more delayed versions of the audio signal on the receive signal path. As such, the predicted audio signal typically only comprises (weighted) spectral components already comprised within the audio signal on the receive signal path.

As outlined above, the audio signal rendered by the speaker 204 may comprise harmonic (non-linear) distortions of the audio signal on the receive signal path (e.g. caused by acoustic and/or mechanical resonances of the electronic device 100). As such, also the echo cancelled signal may comprise harmonic distortions which are due to the distortions caused by the speaker 204 (and/or by any of the mechanical parts/cavities of the entire device 100 comprising the speaker 204 (see FIGS. 1a and 1b)). Thus, the distortion-caused frequency components are typically not cancelled by the echo canceller 209. The performance of the echo canceller 209 may be determined as the ratio of the power of the echo cancelled signal and the power of the recorded signal prior to echo cancellation (i.e. prior to the echo cancellation adder). A noise floor estimate may be subtracted from the respective power values before calculating the ratio. If this performance measure is determined for a sweep of frequencies f, a performance vs. frequency diagram 206 is determined. In this case, the vertical axis of diagram 206 would represent the remaining echo energy (which corresponds to the inverse of the echo canceller performance 209).

As such, a typical electronic device 100 which is operated in a hands-free mode comprises non-linear distortions within the echo path (i.e. within the signal path of the received audio signal via the speakers 204 and the internal microphone 207) which cannot be reliably removed by the echo cancelling unit 209 within the electronic device 100. It should be noted that a typical electronic device 100 may also exhibit non-linear distortions in a so-called "earpiece mode" (at a reduced degree due to the reduced ear-speaker levels). The non-linear distortions within the echo path cause undesirable acoustic effects which may partly be removed by a so-called echo suppressor 210 (which may also comprise a half-duplex switch configured to attenuate the signal on the receive path and/or the signal on the transmit path with a frequency independent attenuation factor). An echo suppressor 210 (indicated as Non-Linear Processing, NLP in FIG. 2a) typically analyses the audio signal on the receive path and the audio signal on the transmit path. In particular, the echo suppressor 210 may determine the level or power of the audio signals in a plurality of spectral bands or frequency bins. Furthermore, the echo suppressor 210 may determine the ratio of the level or power of the audio signals on the receive path and the transmit path in corresponding spectral bands or frequency bins. If the ratio exceeds a pre-determined threshold, the echo suppressor may switch into a half-duplex attenuation mode, thereby attenuating all spectral bands of the audio signal on the transmit path by a uniform attenuation factor. As a result of such uniform attenuation, the electronic device 100 practically switches into a half-duplex mode, if the echo suppressor 210 determines the presence of a significant amount of echo within one or more spectral bands of the audio signal on the transmit path. This means that the perceived full duplexity of a telephone conversation in hands-free mode is reduced.

Apart from generating disturbing echoes and reducing the perceived full duplexity, the non-linear distortions caused by the electronic device 100 when operated in a hands-free mode may be disturbing to the user of the electronic device 100 when listening to the rendered audio signal. It is therefore desirable to adapt the electronic device 100 such that it does not generate any or only a reduced amount of non-linear distortions when operated in a hands-free mode, thereby improving the perception for the user of the electronic device 100 and the full duplexity. A possible approach is to make use of the Automatic Gain Controller (AGC) 201 in order to attenuate the receive signal such that the (mechanical and/or acoustic) distortions are reduced, when rendering the attenuated receive signal using the transceiver 204.

Figure 3:
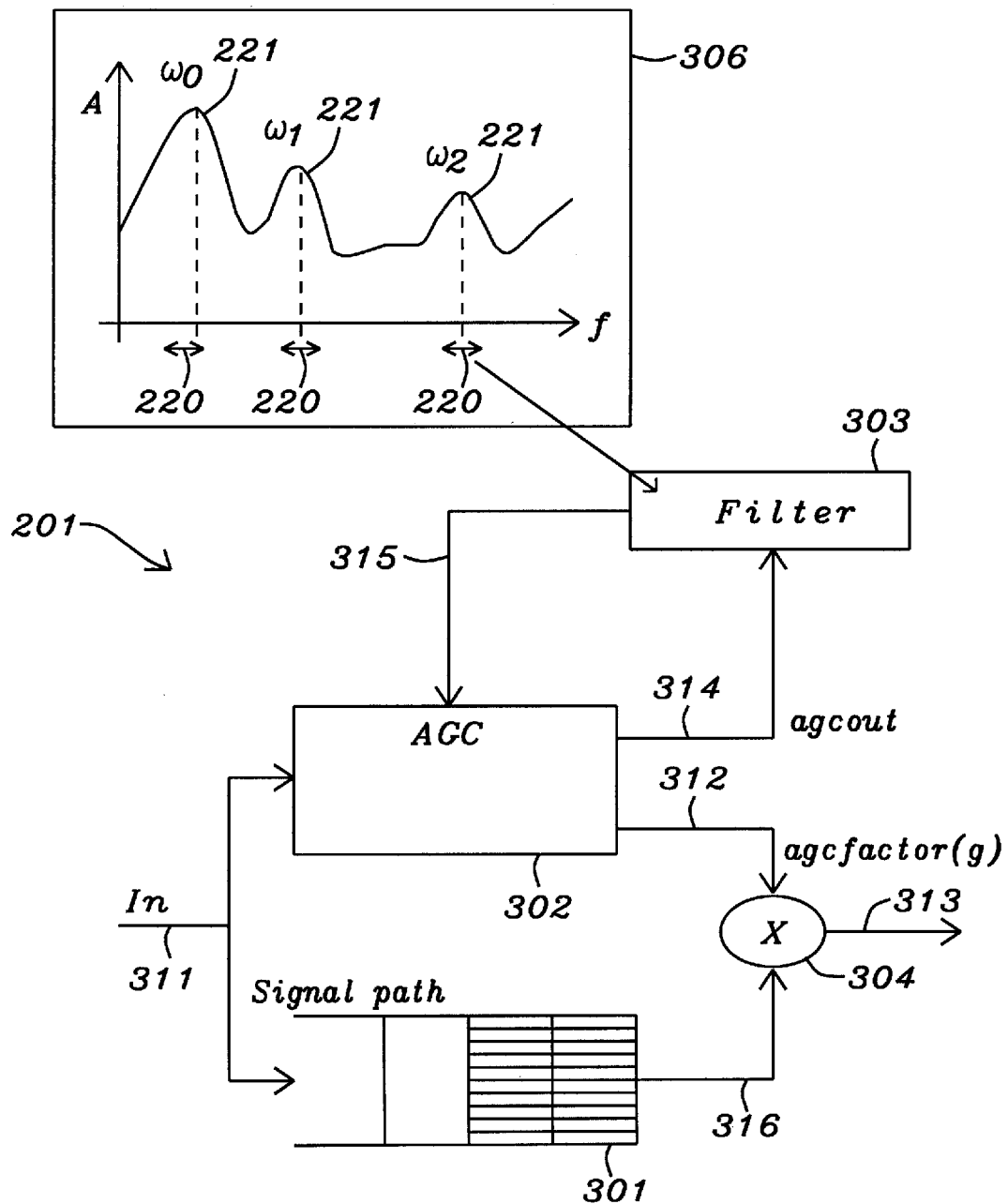
FIG. 3 shows a block diagram of an example Automatic Gain Controller.

FIG. 3 illustrates an example AGC 201 which is configured to adapt a gain factor g (referred to as the "agcfactor") 312 which is applied to a receive signal 311, thereby generating an attenuated receive signal 313 which generates a reduced amount of distortions when being rendered by the transceiver 204 of the electronic device 100.

The AGC 201 of FIG. 3 comprises an amplifier 304 arranged to receive the receive signal 311. The receive signal 311 may be delayed in a delay unit 301 (to yield a delayed receive signal 316), in order to account for the processing time required to determine an appropriate gain factor g 312 for the receive signal 311. The receive signal 311 may be an analogue signal or a digital signal. The amplifier 304 amplifies the delayed receive signal 316 with the gain factor g 312 to obtain an attenuated receive signal 313. The gain factor g 312 may be a frequency independent value, i.e. all frequency components of the receive signal 311 may be multiplied with the same gain factor g 312. The attenuated receive signal 313 may be forwarded to the transducer 204 for rendering.

The AGC 201 further comprises an emphasis filter 303 arranged to receive a feed-forward signal 314 (referred to as agcout), which may be a copy of the receive signal 311. The emphasis filter 303 may be configured to apply a frequency-dependent filter to the feed-forward signal 314 to obtain a filtered signal 315. The frequency-dependent filter may have a transfer function with a frequency-dependent filter gain. The frequency-dependent filter gain may be arranged to emphasize frequencies of the feed-forward signal 314 within a predetermined frequency range. The frequency-dependent filter gain may be determined based on a rendering characteristic of the electronic device 100, e.g. based on the THD and/or the echo canceller performance 206 of the electronic device 100.

The AGC 201 in FIG. 3 further comprises a gain controller 302, which receives the filtered signal 315. The gain controller 302 may be configured to detect a signal strength of the filtered signal 315. The signal strength may be a level of the filtered signal 315, and may be detected e.g. from determining an average of amplitude over a predetermined period of time of the filtered signal 315. The signal strength may alternatively relate to a signal power, which may be detected e.g. from determining a root-mean-square average over a predetermined period of time of the filtered signal 315. The gain controller 302 (referred to as AGC in FIG. 3) may determine the signal strength of the filtered signal 315 and may determine the gain factor g 312 from the determined signal strength of the filtered signal 315. The gain factor 312 may then be provided to the amplifier 304 which amplifies (or attenuates) the delayed receive signal 316 to obtain the attenuated receive signal 313, e.g. using a multiplier.

Hence, the AGC 201 of FIG. 3 comprises an emphasis filter 303 which is arranged to apply a frequency-dependent filter to a copy of the receive signal 311 in order to obtain a filtered signal 315. A level detector comprised within the gain controller 302 makes use of the filtered signal 315 rather than the receive signal 311 in order to determine a signal strength. The frequency-dependent filter applied by the emphasis filter 303 may be designed according to a predetermined specification. The frequency-dependent filter may emphasize (i.e., enhance) specific frequencies of the receive signal 311 to obtain a filtered signal 315 with an increased level. The signal strength of the filtered signal 315 may be taken as a reliable indication of the presence and the extent of distorting frequencies within the receive signal 311. The gain factor g 312 may be determined such that the attenuated receive signal 313 is only attenuated when such specific distorting frequencies are present. On the other hand, the gain factor g 312 may be determined such that the attenuated receive signal 313 is not attenuated when such specific distorting frequencies are not present. Overall, this results in an increased overall signal level of the attenuated receive signal 313.

The frequency-dependent emphasis filter 303 may thus e.g. emphasize specific frequencies corresponding to frequencies where the transducer 204/the electronic device 100 show unwanted behavior, such as where the transducer 204 shows distortion and/or where the transducer 204 shows a resonance such as resonant frequencies in the speaker's acoustic cabinet and/or where the transducer 204 shows unwanted behavior of non-acoustic nature such as unwanted effects caused by speaker voice coil temperature. The frequency-dependent filter may reflect the performance characteristic (also referred to as rendering characteristic) of the transducer 204, i.e. the frequency-dependent filter may have a similar spectral shape as the performance characteristic of the transducer 204. The performance characteristic may e.g. correspond to the THD characteristic of the transducer 204 or to the echo canceller performance, which may be represented as THD(f), wherein f denotes the frequency and wherein THD(f) is a real number (in FIGS. 3 and 4 the parameter $\omega$ is used to indicate the radial frequency). The frequency-dependent filter may be determined in consideration of the THD characteristic. The frequency-dependent gain of the frequency-dependent filter may be referred to as "emphasize gain function" or "filter gain", and will be denoted with G (f), wherein f (or $\omega$) denotes the frequency.

As such, the THD vs. frequency or the echo canceller performance vs. frequency diagram 206 can be used to determine an emphasize gain function G (f) 306. The emphasize gain function G (f) may be approximated by one or more peaking filters (also referred to as shelving filters). By way of example, the emphasize gain function G (f) may be determined from the performance vs. frequency curve (referred to as THD (17) by the formula G (f)=max (THD (f), THDavg)/THDavg, wherein THDavg is the average THD across the frequencies f. This results in an emphasize gain function G (f) which is equal to 1, whenever the performance curve is below its average value THDavg. THDavg may be replaced by a target THD referred to by THDtarget. In addition, the emphasize gain function G (f) may comprise one or more bumps or elevations greater than 1. Each of these bumps may represent a problem area 220 (or predetermined frequency range), for which the speaker 204 (and/or the device 100) creates undesirable distortions. Each problem area 220 is described by a center frequency (also referred to as emphasis frequency) ($\omega 0$, $\omega 1$, $\omega 2$ in FIG. 3) and an emphasis bandwidth or Q factor. It is proposed to model the emphasis gain function G (f) in each of these problem areas by a dedicated peaking filter. This means, in case of N problem areas (e.g. N=1, 2, 3, 4, 5), N peaking filters are determined, wherein each peaking filter models the emphasize gain function G (f) of a corresponding one of the N problem areas 220. Typically, an IIR filter is used as a peaking filter. In particular, a second order (bi-quad) IIR filter may be used as a peaking filter. Also higher order IIR may be used as peaking filters. This may be particularly relevant for approximating a problem area 220 with a high Q factor (i.e. with a high emphasis gain and with a small emphasis bandwidth). It should be noted that the N peaking filters may have other topologies, e.g. a FIR (finite impulse response) filter topology. The N peaking filters may be designed such that the energy of the signal components of the signal 314, which lie within the problem area 220, is amplified (e.g. in the range of 1 dB up to 12 dB), whereas the energy of the signal components of the signal 314, which lie outside of the problem area 220, remains substantially unchanged. As such, the overall emphasize gain function G (f) can be approximated by a sequence of N peaking filters.

In other words, FIG. 3 discloses a compressor/limiter 201 configured as a peak limiter. The feedback loop of the limiter 201 comprises an amplifier 304, similar to a "Sideband Compressor". Such a "Sideband Compressor" attenuates the full frequency band of the audio signal on the receive path, based on the signal level of the audio signal in a relatively narrow sub-band of the full frequency band.

As outlined above, in hands-free applications, the acoustic echo canceller 209 typically suffers from the effects of non-linear distortions by the speaker 204 and the cabinet or housing of the electronic device 100. As discussed in the context of FIG. 1, various mechanic and acoustic factors contribute to these distortions. By measuring the THD versus frequency characteristic 206 of the speaker and cabinet together, the problematic frequency ranges 220 can be identified. These frequency ranges 220 may then be used as a design input for the configuration of the emphasis filter 303 in the AGC loop. As a result, the AGC 201 may be configured to limit the signal energy, whenever the energy of the receive signal 311 in the problematic areas 220 exceeds a signal level threshold.

As discussed above, there are various ways for configuring the emphasis filter 303. One way is to measure the THD with an external reference microphone 205 and to identify the problematic frequency ranges 220 of the THD curve 206. Another way is to measure the echo canceller performance vs. frequency using the internal microphone 207. In frequency ranges 220 that show increased problems with nonlinear behavior of the echo path, the overall echo canceller performance will be degraded.

Figure 4:
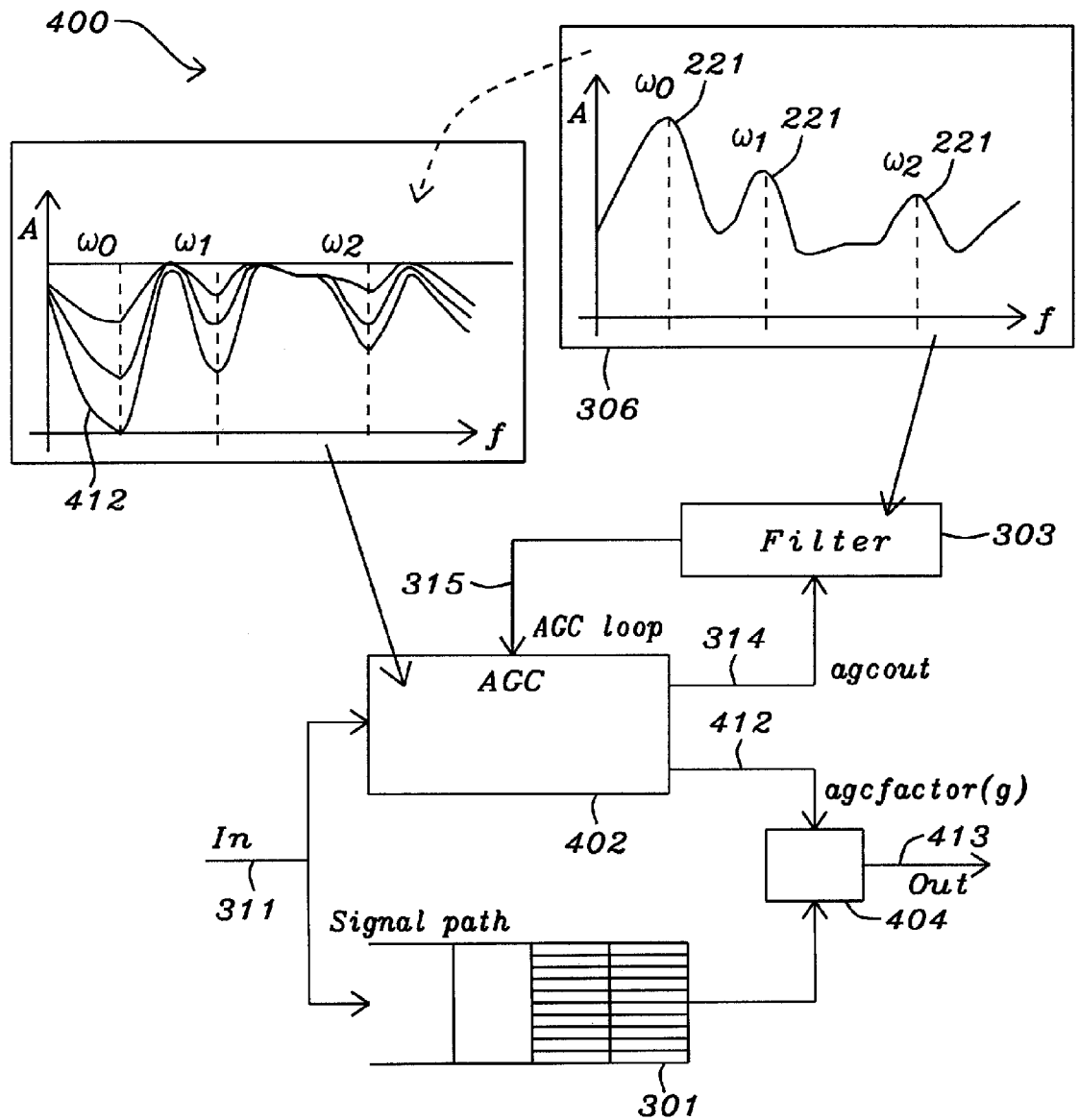
FIG. 4 shows a block diagram of an example Automatic Gain Controller adapted to apply a frequency-dependent AGC filter.

In the present document, it is proposed to modify the operation of an AGC routine such that the AGC routine 'notches out' the problematic areas 220 that are identified during the design of the emphasis-filter 303. In other words, it is proposed to apply a frequency-dependent gain 412 (also referred to as a frequency-dependent AGC filter 412 described e.g. using a set of filter coefficients) to the receive signal 311 such that the receive signal 311 is attenuated (only) within the problematic frequency ranges 220, while the receive signal 311 remains substantially unaffected for frequencies lying outside of the problematic frequency ranges 220. This is illustrated in FIG. 4 which shows the block diagram of an example AGC 400 adapted to apply a frequency-dependent gain 412. It is illustrated that the gain controller 402 determines the frequency-dependent AGC filter 412, wherein the frequency-dependent AGC filter 412 is adapted to attenuate the receive signal 311 relatively more within the problematic frequency ranges 220, compared to the remaining frequency ranges. The frequency-dependent AGC filter 412 is applied to the (delayed) receive signal 311 in an AGC filter unit 404 to yield the attenuated receive signal 413.

As such, the AGC routine becomes an adaptive shaped response filter 412 (instead of a frequency-independent gain factor g 312) that starts attenuating when the energy in the (emphasized) audio band of the receive signal 311 is above a programmable threshold. The AGC routine may increase attenuation of the shaped response filter 412 until the energy of the attenuated receive signal 413 is below the programmed signal level threshold or THD threshold. In an embodiment the shaped response filter 412 may be provided by cascading one or more notch filters.

The frequency-dependent AGC filter 412 (also referred to as the adaptive shaped response filter 412) may be derived in a similar manner to the emphasis-filter 303. In particular, the frequency response H (f) of the frequency-dependent AGC filter 412 may be proportional to 1/G (f). By way of example, the AGC filter 412 may be determined based on the THD and/or the echo canceller performance characteristic 206. As outlined above, the THD and/or echo canceller performance provides one or more problem areas 220. Each problem area 220 may be described by a center frequency ($\omega 0$, $\omega 1$, $\omega 2$ in FIG. 4) and a bandwidth. It is proposed to model each of these problem areas 220 by a dedicated notch filter. This means, in case of N problem areas (e.g. N=1, 2, 3, 4, 5), N notch filters are determined; wherein each notch filter models the AGC filter 412 in a corresponding one of the N problem areas. Typically, an IIR (Infinite Impulse Response) filter is used as a notch filter. In particular, a second order (bi-quad) IIR filter may be used as a notch filter. Also higher order IIR may be used as notch filters. This may be particularly relevant for providing a notch filter for a problem area 220 requiring a relatively high degree of attenuation and having a relatively small bandwidth. It should be noted that the N notch filters may have other topologies, e.g. a FIR (finite impulse response) filter topology. The N notch filters may be designed such that the energy of the signal components of the receive signal 311, which lie within the problem area 220, is attenuated, whereas the energy of the signal components of the receive signal 311, which lie outside of the problem area, remains substantially unchanged. As such, the overall AGC filter H (f) can be provided by a sequence of N notch filters.

The degree of attenuation provided by each of the N notch filters may depend on the signal level of the receive signal 311 or the emphasized receive signal 315. By way of example, the degree of attenuation of the N notch filters may increase with increasing signal level of the emphasized receive signal 315. This is illustrated in FIG. 4 where different AGC filters 412 are illustrated. It can be seen that the degree of attenuation provided at the center frequencies $\omega 0$, $\omega 1$, $\omega 2$ of each notch filter may be varied, thereby varying the degree of attenuation applied to the receive signal 311 at these frequencies $\omega 0$, $\omega 1$, $\omega 2$. By adapting the degree of attenuation within the problematic areas 220 to the signal level of the emphasized receive signal 315, it can be ensured that the distorting frequencies are effectively removed from the receive signal 311, thereby avoiding distortions caused by the transducer 204/electronic device 100, while at the same time maintaining a relatively high overall (e.g. average) signal level of the attenuated receive signal 413.

With the above described method, the output energy towards the speaker 204 may be maximized (increased), while problems caused by the nonlinear behavior of the echo cancellation path can be reduced. The method can be further improved by controlling the degree of attenuation of each notch filter independently. In other words, the AGC 400 may comprise a series of notch-attenuation AGCs, where every stage controls the attenuation of a single notch filter. By way of example, the signal level of the emphasized receive signal 315 may be determined for each problematic area 220 separately, thereby providing N signal levels for N different frequency ranges 220. The degree of attenuation of the N notch filters may be determined based on the N signal levels for the N different frequency ranges 220, respectively, thereby adapting the degree of attenuation individually to each of the N problematic areas 220. By doing this, the energy of the attenuated receive signal 413 may be further increased, while at the same time removing undesirable distortions at the transceiver 204/electronic device 100.

An electronic device 100 comprising a frequency-dependent AGC filter 412 may have a frequency response which depends on the signal level. In order to reduce this effect, a signal strength threshold may be defined for each of the N predetermined frequency ranges. If the signal strength is below the signal strength threshold, the respective notch filter does not apply any substantial attenuation.

On the other hand, if the signal strength is above the signal strength threshold, the respective notch filter applies an attenuation (which increases with increasing signal strength). As a result, only for higher signal levels, where the nonlinearity problems get stronger, the proposed AGC will be applied. It may be assumed that the resonance behavior itself will enhance the acoustic frequency response in the areas that are attenuated by the proposed circuit.

Figure 5:
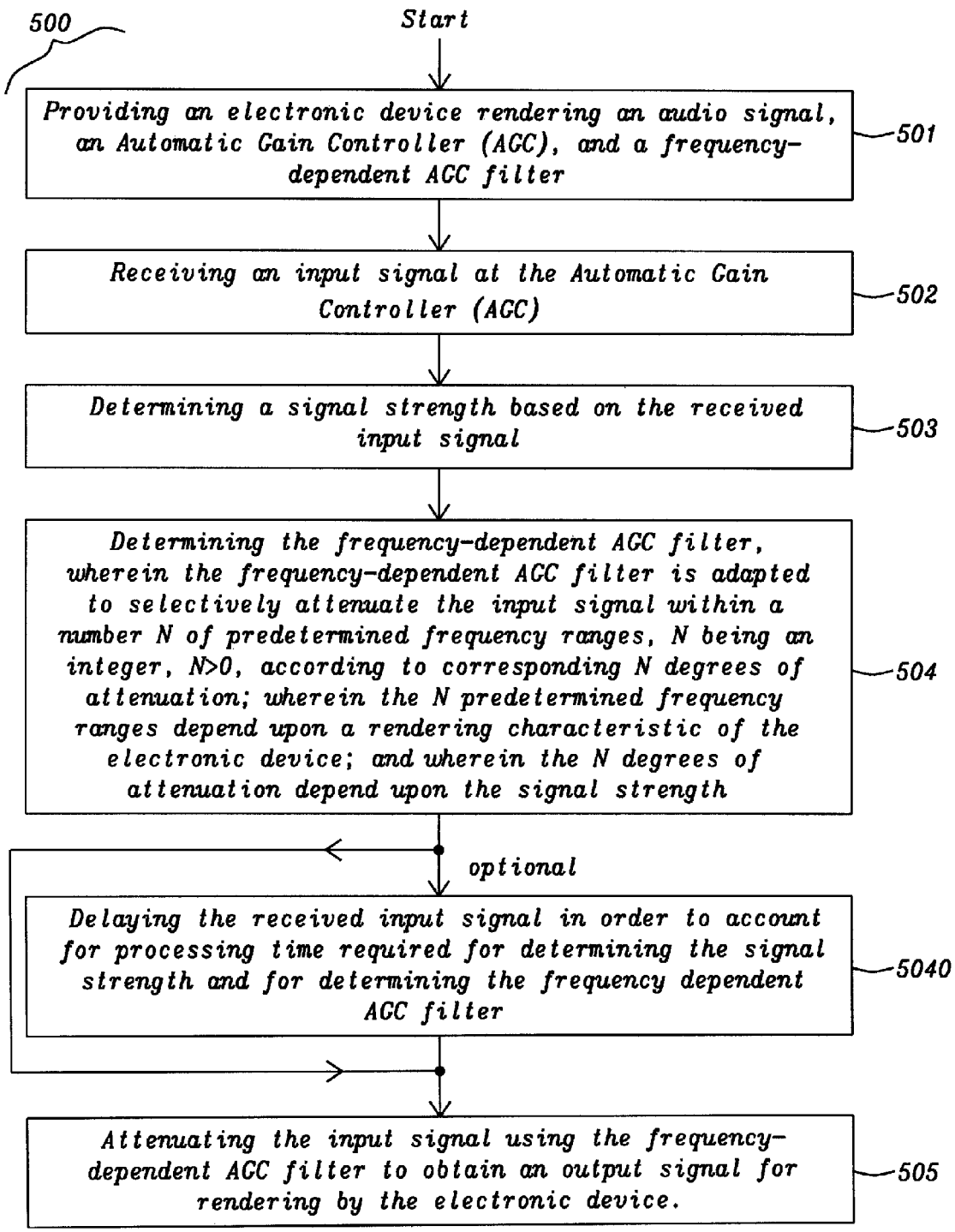
FIG. 5 illustrates a flow chart of a method for reducing the distortions caused by an electronic device operated in hands-free mode.

FIG. 5 illustrates a flow chart of a method 500 for reducing the distortions caused by an electronic device 100 operated in hands-free mode. The flowchart 500 illustrates in step 501 providing an electronic device rendering an audio signal, an Automatic Gain Controller (AGC), and a frequency-dependent AGC Furthermore the method comprises the step 502 of receiving an input signal 311 (e.g. the receive signal 311) at an Automatic Gain Controller 400. The method proceeds by determining (step 503) a signal strength based on the received input signal 311 (e.g. a signal strength of the possibly emphasized input signal 311 or a signal strength of the possibly emphasized output signal 413). The signal strength may e.g. be determined within the gain controller 402. In an embodiment, the signal strength is determined based on an emphasized input signal 315 which has been determined using the emphasis filter 303. An overall signal strength for the overall frequency range of the received input signal 311 may be determined. Alternatively or in addition, sub-signal strengths may be determined e.g. for the different problematic frequency ranges 220 of the received input signal 311.

The method continues by determining (step 504) the frequency-dependent AGC filter 412, wherein the frequency-dependent AGC filter is adapted to selectively attenuate the input signal within a number N of predetermined frequency ranges, N being an integer, N>0, according to corresponding N degrees of attenuation; wherein the N predetermined frequency ranges depend upon a rendering characteristic of the electronic device; and wherein the N degrees of attenuation depend upon the signal strength. As outlined above, the frequency-dependent AGC filter 412 is adapted to selectively attenuate the received input signal 311 within a number N of predetermined frequency ranges 220 (i.e. within the problematic frequency ranges 220). The number N may be an integer equal to one or greater than one. The frequency-dependent AGC filter 412 may be adapted to apply a certain degree of attenuation to the received input signal 311 within the N predetermined frequency ranges 220. The degree of attenuation for frequencies outside of the predetermined frequency ranges 220 may be substantially zero. As outlined above, the N predetermined frequency ranges 220 depend upon a rendering characteristic (e.g. the THD or the echo canceller performance) of the electronic device 100 operated in hands-free mode. The degrees of attenuation applied within the N predetermined frequency ranges 220 depend upon the signal strength. Furthermore, the degrees of attenuation may also depend on the rendering characteristic of the electronic device 100. By way of example, the degrees of attenuation may be proportional to a degree of distortions reflected by the rendering characteristics (e.g. proportional to the THD (f) curve or the echo canceller performance curve 206).

The method 500 may comprise the optional step 5040 of delaying the received input signal 311 in order to account for processing time required for determining the signal strength and for determining the frequency-dependent AGC filter 402. Such delay may be used for compensation of settling time in case of a feedback configuration. Furthermore, the method 500 comprises the step 505 of attenuating the (delayed) input signal 311 using the frequency-dependent AGC filter 412 to obtain an output signal 413 (e.g. the attenuated receive signal 413) for rendering by the electronic device 100.

Figure 6A:
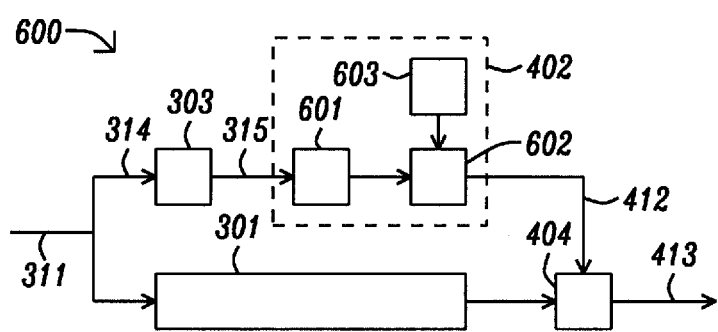
FIG. 6a shows another block diagram of an example Automatic Gain Controller adapted to apply a frequency-dependent AGC filter.

FIG. 6a shows another block diagram of an example Automatic Gain Controller 600 adapted to apply a frequency-dependent AGC filter. The AGC 600 corresponds to the AGC 400 shown in FIG. 4 and shows further details of the gain controller 402. The copy 314 of the receive signal 311 may be processed by an optional emphasis filter 303 to yield a filtered signal 315, wherein the emphasis filter 303 is configured to emphasize the frequency components of the receive signal 311, which lie within the N predetermined frequency ranges 220, relative to the other frequency components of the receive signal 311. The gain controller 402 comprises a signal strength determination unit 601 which is configured to determine a signal strength (e.g. a signal level or a signal power) of the filtered signal 315 (or of the receive signal 311). The signal strength determination unit 601 may also be configured to determine N sub-signal strengths for the N predetermined frequency ranges 220.

The determined signal strength (and/or the N sub-signal strengths) is passed to an AGC filter determination unit 602. The AGC filter determination unit 602 is adapted to select an AGC filter 412 from an AGC filter database 603 using the determined signal strength. The AGC filter database 603 comprises a plurality of pre-determined AGC filters. Each of the plurality of pre-determined AGC filters is adapted to apply different degrees of attenuation within the N predetermined frequency ranges 220. This is illustrated in FIG. 4, where three different AGC filters 412 are illustrated, wherein each of the AGC filters 412 is adapted to apply different degrees of attenuation within the N predetermined frequency ranges 220. The plurality of pre-determined AGC filters may be assigned to a plurality of signal strength values. The degree of attenuation of the plurality of pre-determined AGC filters within a predetermined frequency range may increase with increasing signal strength value. As such, the AGC filter determination unit 602 may be adapted to select an AGC filter 412 from the plurality of pre-determined AGC filters, wherein the assigned signal strength value of the selected AGC filter 412 is closest to the determined signal strength of the filtered signal 315.

Alternatively, the AGC filter determination unit 602 may be adapted to design an AGC filter 412 based on the N sub-signal strengths. The AGC filter database 603 may comprise a plurality of sub-filters for each of the N predetermined frequency ranges 220. The plurality of pre-determined sub-filters for a predetermined frequency range 220 may be assigned to different sub-signal strength values. The AGC filter determination unit 602 may be adapted to select a sub-filter from the plurality of pre-determined sub-filters, wherein the assigned sub-signal strength value of the selected sub-filter is closest to the determined sub-signal strength. The AGC filter determination unit 602 may be adapted to select an appropriate sub-filter for each of the N predetermined frequency ranges 220, thereby designing an overall AGC filter 412.

The selected or designed AGC filter 412 is applied to the (delayed) receive signal 311 in the AGC filter unit 404, thereby yielding the attenuated receive signal 413.

Figure 6B:
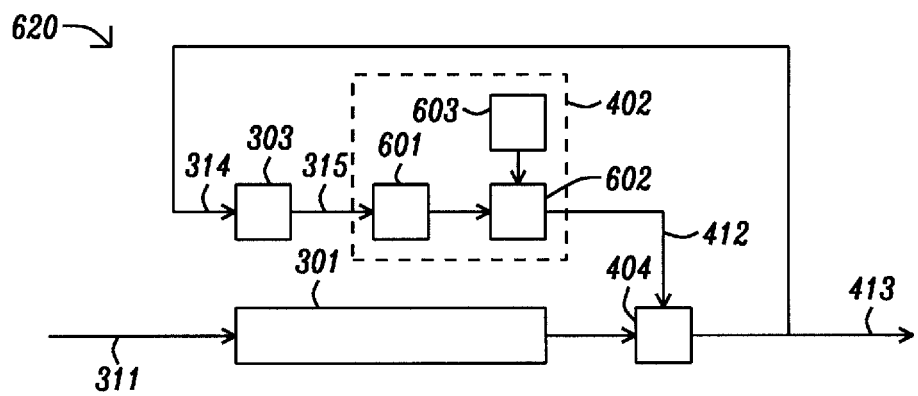
FIG. 6b shows a further block diagram of an example Automatic Gain Controller adapted to apply a frequency-dependent AGC filter.

FIG. 6b shows another block diagram of an example Automatic Gain Controller 620 adapted to apply a frequency-dependent AGC filter. The AGC 620 makes use of a feedback configuration where a copy 314 of the attenuated receive signal 413 is processed to determine the AGC filter 412. The copy 314 of the attenuated receive signal 413 may be processed by an optional emphasis filter 303 to yield a filtered signal 315, wherein the emphasis filter 303 is configured to emphasize the frequency components of the attenuated receive signal 413, which lie within the N predetermined frequency ranges 220, relative to the other frequency components of the attenuated receive signal 413. The gain controller 402 comprises a signal strength determination unit 601 which is configured to determine a signal strength (e.g. a signal level or a signal power) of the filtered signal 315 (or of the attenuated receive signal 413). The signal strength determination unit 601 may also be configured to determine N sub-signal strengths for the N predetermined frequency ranges 220.

The determined signal strength (and/or the N sub-signal strengths) is passed to an AGC filter determination unit 602. The AGC filter determination unit 602 is adapted to select an AGC filter 412 from an AGC filter database 603 using the determined signal strength. The AGC filter database 603 comprises a plurality of pre-determined AGC filters. Each of the plurality of pre-determined AGC filters is adapted to apply different degrees of attenuation within the N predetermined frequency ranges 220. This is illustrated in FIG. 4, where three different AGC filters 412 are illustrated, wherein each of the AGC filters 412 is adapted to apply different degrees of attenuation within the N predetermined frequency ranges 220. The plurality of pre-determined AGC filters may be assigned to a plurality of signal strength values. The degree of attenuation of the plurality of pre-determined AGC filters within a predetermined frequency range may increase with increasing signal strength value. As such, the AGC filter determination unit 602 may be adapted to select an AGC filter 412 from the plurality of pre-determined AGC filters, wherein the assigned signal strength value of the selected AGC filter 412 is closest to the determined signal strength of the filtered signal 315.

Alternatively, the AGC filter determination unit 602 may be adapted to design an AGC filter 412 based on the N sub-signal strengths. The AGC filter database 603 may comprise a plurality of sub-filters for each of the N predetermined frequency ranges 220. The plurality of pre-determined sub-filters for a predetermined frequency range 220 may be assigned to different sub-signal strength values. The AGC filter determination unit 602 may be adapted to select a sub-filter from the plurality of pre-determined sub-filters, wherein the assigned sub-signal strength value of the selected sub-filter is closest to the determined sub-signal strength. The AGC filter determination unit 602 may be adapted to select an appropriate sub-filter for each of the N predetermined frequency ranges 220, thereby designing an overall AGC filter 412.

The selected or designed AGC filter 412 is applied to the (delayed) receive signal 311 in the AGC filter unit 404, thereby yielding the attenuated receive signal 413.

In the present document, an AGC and a corresponding attenuation method have been described which allow for an increased overall output level of a receive signal at an electronic device operated in hands-free mode, while at the same time reducing acoustic and mechanic distortions caused by the rendering of the receive signal by the electronic device. The AGC and the corresponding attenuation method make use of one or more notch attenuation filters which are configured to attenuate the receive signal in one or more corresponding distorting frequency ranges. The degree or depth of attenuation of the one or more notch attenuation filters can be adapted to the signal level of the receive signal in the one or more distorting frequency ranges.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A method for reducing distortions incurred by an audio signal when being rendered by an electronic device, the method comprising:
receiving an input signal;
determining a signal strength based on the input signal;
determining a frequency-dependent AGC filter; wherein the frequency-dependent AGC filter is configured to selectively attenuate the input signal within a number N of predetermined frequency ranges, N being an integer, N>0, according to corresponding N degrees of attenuation; wherein the N predetermined frequency ranges depend upon a rendering characteristic of the electronic device; wherein the N degrees of attenuation depend upon the signal strength; wherein each of the N predetermined frequency ranges comprises a center frequency and an distortion bandwidth; wherein the input signal comprises non-distorting components at frequencies which are not comprised within the N predetermined frequency ranges; and the non-distorting components are not substantially attenuated by the frequency-dependent AGC filter; and
attenuating the input signal using the frequency-dependent AGC filter to obtain an output signal for rendering by the electronic device.

2. The method of claim 1, wherein the AGC filter comprises a sequence of N sub-filters, each one of the N sub-filters having a frequency response configured to selectively attenuate the input signal within a corresponding one of the N predetermined frequency ranges according to a corresponding one of the N degrees of attenuation.

3. The method of claim 2, wherein each of the corresponding N sub-filters is a bi-quad IIR filter.

4. The method of claim 1, further comprising
applying an emphasis filter to at least one of a copy of the input signal or a copy of the output signal to obtain a filtered signal; wherein the emphasis filter is configured to emphasize a signal within the N predetermined frequency ranges; wherein the emphasis filter comprises a sequence of N sub-emphasis-filters; wherein each one of the N sub-emphasis-filters has a frequency response configured to emphasize a signal within a corresponding one of the N predetermined frequency ranges; and
determining the signal strength based on the filtered signal.

5. The method of claim 1, further comprising
determining N signal strengths based on the input signal in the N predetermined frequency ranges, respectively; and
determining the N degrees of attenuation based on the N signal strengths, respectively.

6. The method of claim 1, wherein the rendering characteristic is represented by one or more of: a frequency dependent total harmonic distortion of the electronic device, an echo canceller performance of an echo canceller comprised within the electronic device, a battery level of a battery comprised within the electronic device and a volume setting of a volume controller comprised within the electronic device.

7. The method of claim 1, wherein
the method comprises determining whether the signal strength is greater than a predetermined signal strength threshold; and
the attenuating is only performed if the signal strength is greater than the predetermined signal strength threshold.

8. The method of claim 1, wherein the N degrees of attenuation increase with increasing signal strength.

9. The method of claim 1, wherein the N degrees of attenuation are also dependent on the rendering characteristic.

10. The method of claim 1, further comprising delaying the input signal prior to attenuating the input signal.

11. An automatic gain controller configured to reduce distortions incurred by an audio signal when being rendered by an electronic device, the automatic gain controller comprising:
a gain controller configured to
determine a signal strength based on an input signal to be rendered by the electronic device; and
determine a frequency-dependent AGC filter; wherein the frequency-dependent AGC filter is configured to selectively attenuate the input signal within a number N of predetermined frequency ranges, N being an integer, N>0, according to corresponding N degrees of attenuation; wherein the N predetermined frequency ranges depend upon a rendering characteristic of the electronic device; wherein the N degrees of attenuation depend upon the signal strength; wherein each of the N predetermined frequency ranges comprises a center frequency and an distortion bandwidth; wherein the input signal comprises non-distorting components at frequencies which are not comprised within the N predetermined frequency ranges; and the non-distorting components are not substantially attenuated by the frequency-dependent AGC filter; and
an AGC filter unit configured to attenuate the input signal using the frequency-dependent AGC filter to obtain an output signal for rendering by the electronic device.

12. An electronic device comprising
a reception unit configured to receive an audio input signal for rendering at the electronic device;
a transducer configured to render an audio output signal derived from the audio input signal; and
an automatic gain controller according to claim 11, configured to determine the audio output signal from the audio input signal, such that nonlinear distortions caused by the rendering of the audio output signal are reduced compared to nonlinear distortions caused by the rendering of the audio input signal.

13. An Automatic Gain controller configured to apply a frequency-dependent AGC filter to receive signals comprising:
a gain controller comprising:
a signal strength determination unit configured to determine N sub-signal strengths of the receive signal for N predetermined frequency ranges, wherein N is an integer number N>0;
an AGC filter determination unit configured to select an AGC filter from an AGC filter database using the determined signal strength by the signal strength determination unit wherein the AGC filter selected to a receive signal of the AGC controller in a AGC filter unit; and
said AGC filter database comprising a plurality of pre-determined AGC filters, wherein each of the plurality of pre-determined AGC filters is configured to apply different degrees of attenuation within the N predetermined frequency ranges; wherein each of the N predetermined frequency ranges comprises a center frequency and an distortion bandwidth; wherein the receive signal comprises non-distorting components at frequencies which are not comprised within the N predetermined frequency ranges; and the non-distorting components are not substantially attenuated by the frequency-dependent AGC filter; and
said AGC filter unit yielding an attenuated receive signal.

14. The Automatic Gain controller of claim 13 wherein an emphasis filter is configured to emphasize frequency components of an input signal of the emphasis filter, which lie within the N predetermined frequency ranges, relative to the other frequency components of the input signal and yields a filtered signal instead of the receive signal to the signal strength determination unit.

15. The Automatic Gain controller of claim 14 wherein said input signal is a copy of the receive signal of the Automatic Gain controller.

16. The Automatic Gain controller of claim 14 wherein said input signal is a copy of an attenuated receive signal of the Automatic Gain controller.

17. The Automatic Gain controller of claim 13 wherein the receive signal is delayed in a delay unit to yield a delayed receive signal to the AGC filter unit in order to account for the processing time required to determine an appropriate gain factor for the receive signal.

18. The Automatic Gain controller of claim 13 wherein the receive signal is an analog signal.

19. The Automatic Gain controller of claim 13 wherein the receive signal is a digital signal.

* * * * *